(12) United States Patent
Wang et al.

(10) Patent No.: US 9,490,128 B2
(45) Date of Patent: Nov. 8, 2016

(54) NON-MELT THIN-WAFER LASER THERMAL ANNEALING METHODS

(75) Inventors: Yun Wang, Saratoga, CA (US); Andrew M. Hawryluk, Los Altos, CA (US); Xiaoru Wang, Fremont, CA (US); Xiaohua Shen, Fremont, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 13/595,873

(22) Filed: Aug. 27, 2012

(65) Prior Publication Data

US 2014/0057457 A1  Feb. 27, 2014

(51) Int. Cl.
| | |
|---|---|
| *H01L 21/268* | (2006.01) |
| *H01L 27/146* | (2006.01) |
| *H01L 21/02* | (2006.01) |
| *H01L 21/285* | (2006.01) |

(52) U.S. Cl.
CPC ....... *H01L 21/268* (2013.01); *H01L 21/02107* (2013.01); *H01L 27/1469* (2013.01); *H01L 27/14634* (2013.01); *H01L 21/28518* (2013.01)

(58) Field of Classification Search
CPC ............. H01L 21/268; H01L 21/2026; H01L 21/02686; H01L 21/02691
USPC ............... 438/308, 487, 514, 530, 778, 795; 257/E21.134, E21.347, E21.324
See application file for complete search history.

(56) References Cited

U.S. PATENT DOCUMENTS

| | | | |
|---|---|---|---|
| 4,234,356 A | 11/1980 | Auston et al. | |
| 4,375,993 A | 3/1983 | Mori et al. | |
| 5,401,666 A | 3/1995 | Tsukamoto | |
| 5,612,251 A | 3/1997 | Lee | |
| 5,688,715 A | 11/1997 | Sexton et al. | |
| 5,767,003 A | 6/1998 | Noguchi | |
| 5,803,965 A | 9/1998 | Yoon | |
| 5,908,307 A | 6/1999 | Talwar et al. | |
| 5,930,617 A | 7/1999 | Wu | |
| 5,959,779 A | 9/1999 | Yamazaki et al. | |
| 6,066,516 A | 5/2000 | Miyasaka | |
| 6,281,057 B2 | 8/2001 | Aya et al. | |
| 6,303,476 B1 | 10/2001 | Hawryluk et al. | |

(Continued)

FOREIGN PATENT DOCUMENTS

| | | |
|---|---|---|
| JP | 2006-351659 A | 12/2006 |
| JP | 2008-066410 A | 3/2008 |

(Continued)

OTHER PUBLICATIONS

Search Report for Singapore Patent Application No. 201306330-0 from Danish Patent and Trademark Office, dated Jan. 22, 2014.

(Continued)

*Primary Examiner* — Mary Wilczewski
*Assistant Examiner* — Erik T Peterson
(74) *Attorney, Agent, or Firm* — Opticus IP Law PLLC

(57) ABSTRACT

Methods of annealing a thin semiconductor wafer are disclosed. The methods allow for high-temperature annealing of one side of a thin semiconductor wafer without damaging or overheating heat-sensitive electronic device features that are either on the other side of the wafer or embedded within the wafer. The annealing is performed at a temperature below the melting point of the wafer so that no significant dopant redistribution occurs during the annealing process. The methods can be applied to activating dopants or to forming ohmic contacts.

11 Claims, 14 Drawing Sheets

(56) References Cited

U.S. PATENT DOCUMENTS

| | | |
|---|---|---|
| 6,335,509 B1 | 1/2002 | Jung |
| 6,365,476 B1 | 4/2002 | Talwar et al. |
| 6,366,308 B1 | 4/2002 | Hawryluk et al. |
| 6,368,947 B1 | 4/2002 | Yu |
| 6,383,956 B2 | 5/2002 | Hawryluk et al. |
| 6,479,821 B1 | 11/2002 | Hawryluk et al. |
| 6,514,339 B1 | 2/2003 | Jung |
| 6,521,501 B1 | 2/2003 | Erhardt et al. |
| 6,524,977 B1 | 2/2003 | Yamazaki et al. |
| 6,531,681 B1 | 3/2003 | Markle et al. |
| 6,548,361 B1 | 4/2003 | En et al. |
| 6,558,991 B2 | 5/2003 | Yamazaki et al. |
| 6,632,749 B2 | 10/2003 | Miyasaka et al. |
| 6,693,257 B1 | 2/2004 | Tanaka |
| 6,730,550 B1 | 5/2004 | Yamazaki et al. |
| 6,747,245 B2* | 6/2004 | Talwar et al. ............. 219/121.8 |
| 6,974,731 B2 | 12/2005 | Yamazaki et al. |
| 6,987,240 B2 | 1/2006 | Jennings et al. |
| 7,005,601 B2 | 2/2006 | Jennings |
| 7,098,155 B2 | 8/2006 | Talwar et al. |
| 7,279,721 B2 | 10/2007 | Jennings et al. |
| 7,482,254 B2 | 1/2009 | Bakeman |
| 7,494,942 B2 | 2/2009 | Talwar et al. |
| 7,595,208 B2 | 9/2009 | Jennings et al. |
| 7,901,974 B2* | 3/2011 | Venezia et al. ................ 438/73 |
| 7,932,139 B2 | 4/2011 | Bu et al. |
| 7,943,534 B2 | 5/2011 | Matsuno et al. |
| 8,014,427 B1 | 9/2011 | Anikitchev |
| 8,026,519 B1 | 9/2011 | Anikitchev et al. |
| 8,084,814 B2 | 12/2011 | Nemoto et al. |
| 8,309,474 B1* | 11/2012 | Wang et al. .................. 438/795 |
| 2002/0048864 A1 | 4/2002 | Yamazaki et al. |
| 2003/0040130 A1 | 2/2003 | Mayur et al. |
| 2003/0211670 A1 | 11/2003 | Downey |
| 2004/0097103 A1 | 5/2004 | Imai et al. |
| 2004/0198028 A1 | 10/2004 | Tanaka et al. |
| 2004/0253838 A1 | 12/2004 | Yamazaki et al. |
| 2007/0158315 A1 | 7/2007 | Tanaka et al. |
| 2007/0222030 A1 | 9/2007 | Salama et al. |
| 2008/0207094 A1 | 8/2008 | Feng et al. |
| 2008/0299750 A1* | 12/2008 | Spencer et al. .............. 438/530 |
| 2009/0034071 A1 | 2/2009 | Jennings et al. |
| 2009/0261078 A1* | 10/2009 | Ma et al. .................. 219/121.8 |
| 2009/0267200 A1* | 10/2009 | Gutt et al. .................... 257/655 |
| 2009/0278287 A1* | 11/2009 | Wang et al. .................. 264/485 |
| 2009/0311880 A1 | 12/2009 | Jennings et al. |
| 2010/0140675 A1* | 6/2010 | Rhodes .......................... 257/292 |
| 2010/0164042 A1 | 7/2010 | Manabe |
| 2011/0260221 A1 | 10/2011 | Mao et al. |
| 2011/0263069 A1 | 10/2011 | Hsu et al. |
| 2011/0309374 A1* | 12/2011 | Wang et al. ..................... 257/76 |
| 2011/0316107 A1* | 12/2011 | Tsukamoto ................... 257/432 |
| 2012/0083135 A1 | 4/2012 | Tsai et al. |
| 2012/0234810 A1* | 9/2012 | Kudo et al. ............. 219/121.85 |
| 2012/0258564 A1* | 10/2012 | Wang et al. .................... 438/70 |
| 2012/0329204 A1 | 12/2012 | Kurita et al. |

FOREIGN PATENT DOCUMENTS

| | | |
|---|---|---|
| JP | 2011-243836 A | 12/2011 |
| JP | 2012-044046 A | 3/2012 |

OTHER PUBLICATIONS

Cacho et al., Simulation of pattern effect induced by millisecond annealing used in advanced metal-oxide-semiconductor technologies, *J. Appl. Phys.* 108 (1), 14902-14902-9 (2010).

Seino et al., "Backside activation of power device IGBTs by microsecond-pulsed green laser annealing thermally assisted with CW diode laser," 18$^{th}$ IEEE Conf. on Advanced Thermal processing of Semiconductors, RTP 2010, Sep. 28-Oct. 10, 2010, pp. 140-143.

Gutt et al., "Laser thermal annealing for power field effect transistor by using deep melt activation," 14th IEEE Int'. Conf. on Advanced Thermal Processing of Semiconductors, RPT2006 Oct. 10-13, 2006, pp. 193-197.

Written Opinion dated Mar. 30, 2015 for Singapore Patent Application No. 201306330-0 from Danish Patent and Trademark Office, dated Feb. 27, 2015.

Written Opinion for Singapore Patent Application No. 201306330-0 from Danish Patent and Trademark Office, dated Aug. 8, 2014.

Examination Report dated Aug. 27, 2015 for Singapore Patent Application No. 201306330-0 from Danish Patent and Trademark Office.

Office Action dated Jul. 7, 2015, for Japanese Patent Application No. 2013-162856 from Japanese Patent Office.

* cited by examiner

NON-MELT THIN-WAFER LASER THERMAL ANNEALING METHODS

FIELD

The present disclosure relates generally to laser annealing of semiconductor materials when forming integrated circuit structures, and in particular relates to methods of performing non-melt laser thermal annealing of thin semiconductor wafers.

BACKGROUND ART

Laser thermal annealing (LTA) is used in semiconductor manufacturing for a variety of applications, including for activating dopants in select regions of devices (structures) formed in a semiconductor wafer when forming active microcircuits such as transistors and related types of semiconductor features.

One type of laser annealing uses a scanned line image from a light beam to heat the surface of the wafer to a temperature (the "annealing temperature") for a time long enough to activate the dopants in the semiconductor structures (e.g., source and drain regions) but short enough to prevent substantial dopant diffusion. The time that the wafer surface is at the annealing temperature is determined by the power density of the line image, as well as by the line-image width divided by the velocity at which the line image is scanned (the "scan velocity"). The amount of time the line image resides over a point on the wafer surface is called the "dwell time."

For some semiconductor device applications, there is a need to heat one side of the wafer while keeping the other side below a certain critical temperature. One example is a power device, where back-side dopant activation and contact is carried out after the front device is fabricated. Another example is a thin-substrate solar cell, wherein a highly conductive emitter is needed on the front side to improve the cell efficiency, and which can be achieved by doping and annealing. A third example is a back-side image sensor, where a field-stop layer that typically consists of highly doped and activated layers is used on the back side to suppress the dark current.

In all of these examples, there is a need for thermal annealing to activate dopants or form a contact on one side of the wafer. The substrate thicknesses involved are in the range of several to a few hundred micrometers (i.e., microns or μm), which is significantly thinner than the thickness of a standard 8-to-12-inch silicon wafer, namely, 725 μm to 775 μm. Typical dopant activation requires an annealing temperature above about 1,000° C. However, the maximum temperature and thermal budget for the other side of the substrate must be limited to avoid any potential degradation in material integrity and junction dopant profiles associated therewith.

For example, if metallization is already present on a first side of the wafer prior to laser thermal annealing, the maximum temperature of the first side needs to be kept below the melting point of the metal in order to maintain good physical integrity while the opposite (second) side is annealed.

Conventional rapid thermal annealing (RTA) has an annealing time on the order of seconds, which in silicon corresponds to a thermal diffusion length $L_D$ of several millimeters. This length is significantly greater than the typical wafer thickness, which means that both sides of the wafer will see similar peak annealing temperatures during RTA. Consequently, RTA is not suitable for such thin-wafer applications.

Conventional laser annealing methods for such thin-wafer applications involve using a pulsed melt laser with a pulse length in the range of tens to hundreds of nanoseconds. For silicon, this corresponds to a thermal diffusion length on the order of about 1 μm, which is significantly less than most wafer thicknesses. An advantage of pulse-melt annealing is that it can locally heat one side of a wafer to a very high temperature (including above the silicon melting temperature) with almost no heat penetration to the other side. Thus, it can be used for silicon wafers as thin as a few micrometers.

However, in the nanosecond time frame associated with pulse-melt annealing, dopant activation can be achieved only in the melted state. During melting, dopants can quickly diffuse and redistribute into a more box-like profile. While this may be advantageous for some applications, it may not be desirable in cases where precise doping profiles need to be maintained. In particular, the melting of multiple junctions can cause dopants of opposite polarities to intermix and degrade junction performance. A second limitation in the pulsed-melt annealing method is the depth of heat penetration. Because of the short thermal diffusion length, it is difficult to effectively anneal junctions deeper than 0.5 μm. Also, the method cannot be effectively used to anneal out implant defects beyond the melt depth due to the extremely low thermal budget associated with nanosecond-scale pulses.

Accordingly, there is a need for annealing thin semiconductor wafers that allows for efficient non-melt dopant activation on one side of the wafer without causing detrimental heating effects on the other side of the wafer.

SUMMARY

This disclosure is directed to methods of annealing a thin semiconductor wafer such that high-temperature annealing can be performed on one side of a thin semiconductor wafer without damaging or overheating the heat-sensitive features or devices on the other side of the wafer (or embedded within the wafer). The peak temperature is below the melt point of the wafer so that no significant dopant redistribution occurs during the annealing process. The methods can be applied to activating dopants or forming ohmic contacts.

An aspect of the disclosure is a method of annealing a semiconductor product wafer having a back side with an annealing region, the product wafer having electronic device features that reside a distance d from the back side and that are subject to being damaged beyond a critical temperature $T_C$. The method includes scanning an annealing laser beam over the back side to anneal the annealing region by bringing the annealing region up to an anneal temperature $T_A$ that is less than a melt temperature $T_M$ of the semiconductor product wafer. The scanning has a thermal diffusion length $L_D$ attendant therewith, and the method further includes performing the scanning with a dwell time such that thermal diffusion length $L_D$ satisfies $L_D < d$ and wherein the electronic device features are maintained below the critical temperature $T_C$.

Another aspect of the disclosure is the method disclosed above, wherein the annealing region is either an ion-implant layer or a contact layer.

Another aspect of the disclosure is the method disclosed above, wherein the dwell time is in the range from 3 microseconds to 200 microseconds.

Another aspect of the disclosure is the method disclosed above, wherein the electronic device features include metal and wherein the critical temperature $T_C$ is in the range from about 600° C. to about 900° C.

Another aspect of the disclosure is the method disclosed above, further including forming the product wafer by interfacing a device wafer and a carrier wafer, wherein the device wafer includes the electronic device features and has a thickness that defines the distance d.

Another aspect of the disclosure is the method disclosed above, wherein the annealing laser beam has a visible wavelength or an infrared wavelength with an optical absorption length less than the thickness of the device wafer.

Another aspect of the disclosure is the method disclosed above, wherein the electronic device features include a CMOS device layer.

Another aspect of the disclosure is the method disclosed above, wherein the electronic device features include a semiconductor power-device layer.

Another aspect of the disclosure is the method disclosed above, further comprising performing multiple scans of a same portion of the back side, where temporally adjacent scans are separated in time by a time interval τ, wherein 1 millisecond≤τ≤10 seconds.

Another aspect of the disclosure is the method disclosed above, wherein the number of multiple scans is 10 or fewer.

Another aspect of the disclosure is the method disclosed above, wherein 5 μm≤d≤150 μm.

Another aspect of the disclosure is the method disclosed above, wherein 10 μm≤d≤20 μm, the electrical device features are made of aluminum, and a dwell time $t_d$ is in the range from about 3 microseconds to about 20 microseconds.

Another aspect of the disclosure is the method disclosed above, wherein 5 μm≤d≤150 μm, the electrical device features are made of copper, and dwell time $t_d$ is in the range from about 15 microseconds to about 100 microseconds.

Another aspect of the disclosure is a method of annealing a product wafer. The method includes forming a product wafer by forming a protective structure over a front side of a device wafer having a back side and a thickness d between 5 microns and 150 microns, wherein the front side includes electronic device features that are subject to being damaged if heated beyond a critical temperature $T_C$. The method includes forming an annealing region in or on the back side of the device wafer. The method also includes scanning an annealing laser beam over the back side to perform non-melt annealing of the annealing region, wherein the scanning is performed with a dwell time $t_d$ that defines a thermal diffusion length $L_D$<d and wherein the electronic device features are maintained at a temperature below the critical temperature $T_C$.

Another aspect of the disclosure is the method disclosed above, wherein the annealing region is either an ion-implanted doped layer formed in the back side or is a contact layer formed on the back side.

Another aspect of the disclosure is the method disclosed above, further comprising performing multiple scans of a same portion of the back side, wherein temporally adjacent scans are separated by a time interval τ, and wherein 1 millisecond≤τ≤10 seconds.

Another aspect of the disclosure is the method disclosed above, wherein the number of multiple scans is 10 or fewer.

Another aspect of the disclosure is the method disclosed above, wherein the protective structure includes a carrier wafer.

Another aspect of the disclosure is the method disclosed above, wherein the protective structure consists of a single protective layer.

Another aspect of the disclosure is the method disclosed above, wherein the electronic device features include at least one of a metal and a CMOS layer.

Another aspect of the disclosure is the method disclosed above, wherein the electronic device features include a semiconductor power-device layer.

Another aspect of the disclosure is the method disclosed above, wherein the dwell time $t_d$ is in the range from 3 microseconds to 200 microseconds.

Another aspect of the disclosure is the method disclosed above, including selecting the dwell time $t_d$ to be less than a maximum dwell time $t_{dm}$ defined by $t_{dm}=d^2/D_{eff}$ where $D_{eff}$ is the effective thermal diffusivity of the device wafer.

Another aspect of the disclosure is the method disclosed above, wherein the annealing laser beam has a visible wavelength or an infrared wavelength with an optical absorption length less than the thickness of the thin wafer.

All references cited herein are incorporated by reference herein.

The claims as set forth below are incorporated into and constitute a part of the Detailed Description.

In the discussion presented herein, "d" is used interchangeably for both "distance" and "thickness," as these two concepts are closely related as will be understood by one skilled in the art. In some cases, the distance d is the wafer thickness, while more generally the distance d is the distance as measured from the wafer back side to the electronic device features, which can also be the same as the wafer thickness.

DETAILED DESCRIPTION

Reference is now made in detail to embodiments of the disclosure, examples of which are illustrated in the accompanying drawings. Whenever possible, the same or like reference numbers and symbols are used throughout the drawings to refer to the same or like parts.

Figure 1A:
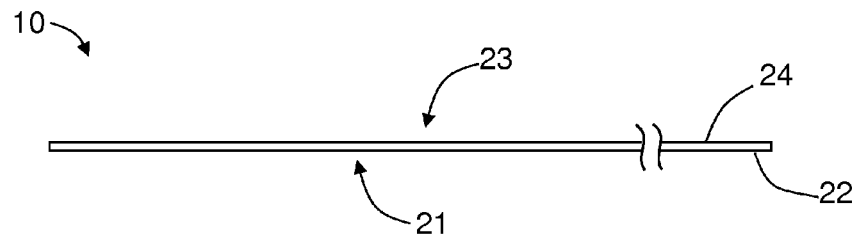
FIGS. 1A through 1C are various views of example product wafers that can be subject to laser annealing using the systems and methods of the present disclosure.

The fabrication of certain types of semiconductor devices, such as image sensors and high-power devices, involves the use of relatively thin semiconductor wafers. FIG. 1A is an example side view of a product wafer 10 having a top side 21 that defines a top surface 22 and a back side 23 that defines a back surface 24. The product wafer 10 of FIG. 1A can be considered to be upside down, since the "top side" 21 faces downward in the Figure.

Figure 1B:
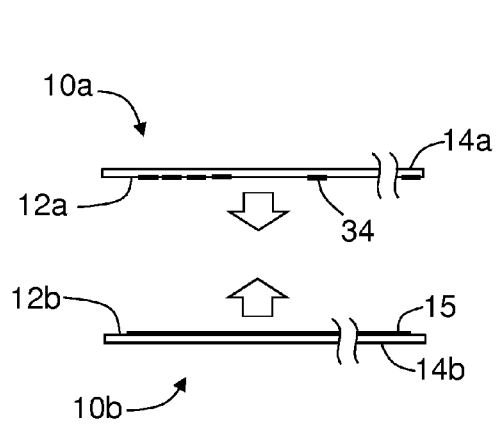

FIG. 1B illustrates the formation of an example product wafer 10 formed by interfacing a device wafer 10a and a carrier wafer 10b. The device wafer 10a has a front side 12a in which electronic device features 34 are formed that is accordingly called the device side. The device wafer 10a also includes a back side 14a that is opposite to the front side (device side) 12a. The carrier wafer 10b has a front side 12b on which an oxide layer 15 is formed. The resulting wafer 10, referred to herein as a product wafer, is formed by interfacing the device side 12a of device wafer 10a with the front side 12b of carrier wafer 10b. The oxide layer 15 serves as a bonding layer that bonds the two wafers 10a, 10b together. Thus, the front side 12b of carrier wafer 10b is also called the bonding side. An example device wafer 10a is formed from a silicon substrate.

Figure 1C:
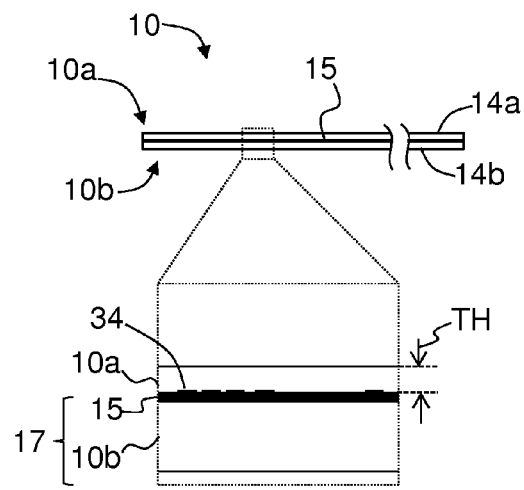

The resulting product wafer 10 is shown in FIG. 1C. At this point, device wafer 10a is ground down from back side 14a to reduce the thickness of the device wafer from about 750 μm to a thickness d in the range from about 5 μm to about 150 μm, as shown in the close-up inset of FIG. 1C. The oxide layer 15 and carrier wafer 10b define a protective structure on top side 21 that serves to protect electronic device features 34, which are now embedded within product wafer 10.

Figure 2A:
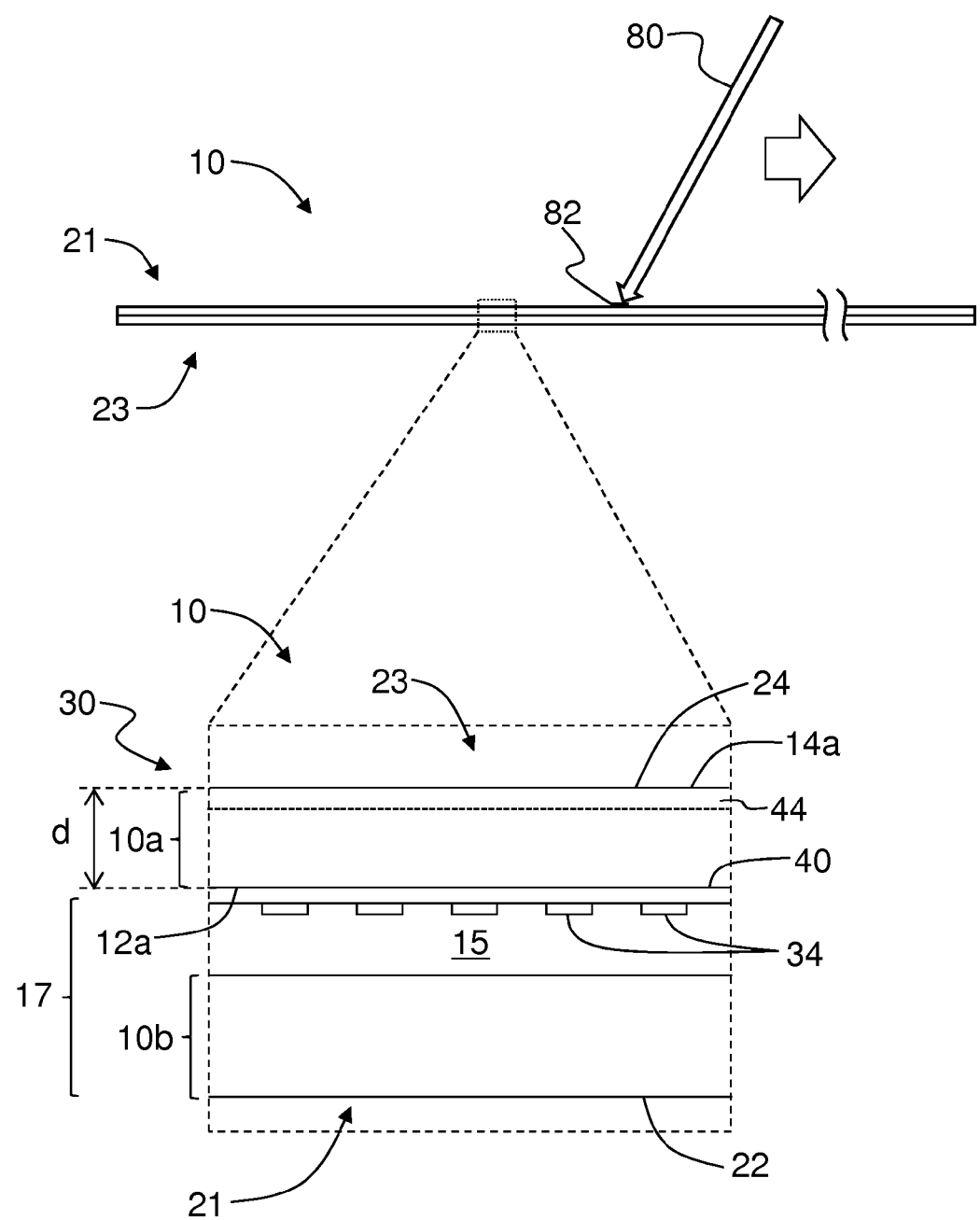
FIG. 2A through FIG. 2D are side views of four different example product wafers and include respective close-up cross-sectional views of the example product wafers.

FIG. 2A is similar to FIG. 1C and includes an inset that shows a more detailed close-up cross-sectional view of an example structure 30 of product wafer 10. The example structure 30 is in the form of a CMOS sensor. The carrier wafer 10b with oxide layer 15 (which is typically several microns thick) supports device wafer 10a, which includes heat-sensitive electronic device features 34. Here, the term "heat-sensitive" means that electronic device features 34 can be damaged if they are heated to beyond a critical temperature $T_C$.

An example of heat-sensitive electronic device features 34 includes metallization elements, which are shown in FIG. 2A as being in contact with an adjacent CMOS device layer 40. The CMOS device layer 40 is in turn supported by the thinned device wafer 10a, which has a thickness d in the range from about 5 μm to 50 μm. In another example of a power device, thickness d is in the range from about 30 μm to about 150 μm.

In an example, a thin ion-implant layer 44 that needs to be laser annealed is formed in the thinned device wafer 10a adjacent its back side 14a, which defines surface 24. The ion-implant layer 44 includes dopants used to form junctions, to reduce leakage current or to lower contact resistance. Example dopants for silicon are arsenic, phosphorus, boron, indium, antimony, etc. Thermal annealing is needed to repair implant damage and to activate the dopants. This process is called back-side-junction activation.

Figure 2B:
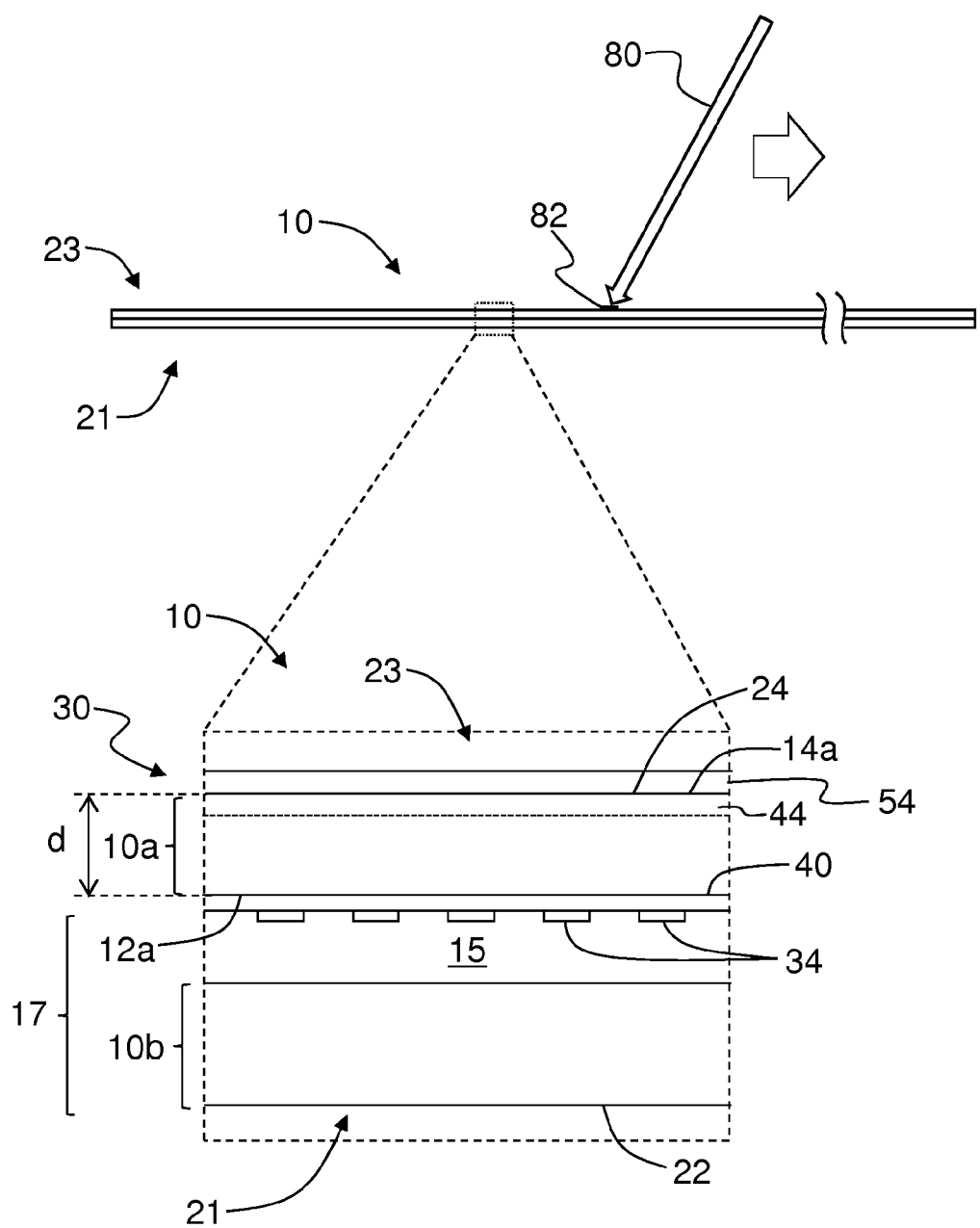

FIG. 2B is similar to FIG. 2A and includes a contact layer 54 atop ion-implant layer 44. The annealing of contact layer 54 results in the alloying of the contact layer with a silicon substrate to form an ohmic contact and is referred to as back-side contact annealing. The contact layer typically consists of thin-film metal stacks. Example metals used to form contact layer 54 include Ti, Ni, Co, W, Al, Cu, Au, Pt, etc. Laser annealing of contact layer 54 can be used to form a metal silicide and to lower the contact resistance of the contact layer.

The annealing of contact layer 54 can also help to activate doped layer 44 underneath the contact layer. However, the maximum annealing temperature in this case may be limited by the silicide degradation or damage to the metal-film stack, and therefore the dopant activation may not be as optimized as in the configuration of product wafer 10 of FIG. 2A. An alternative is to apply laser annealing twice (before and after contact layer 54 deposition) to separately optimize the dopant activation and contact formation.

Figure 2C:
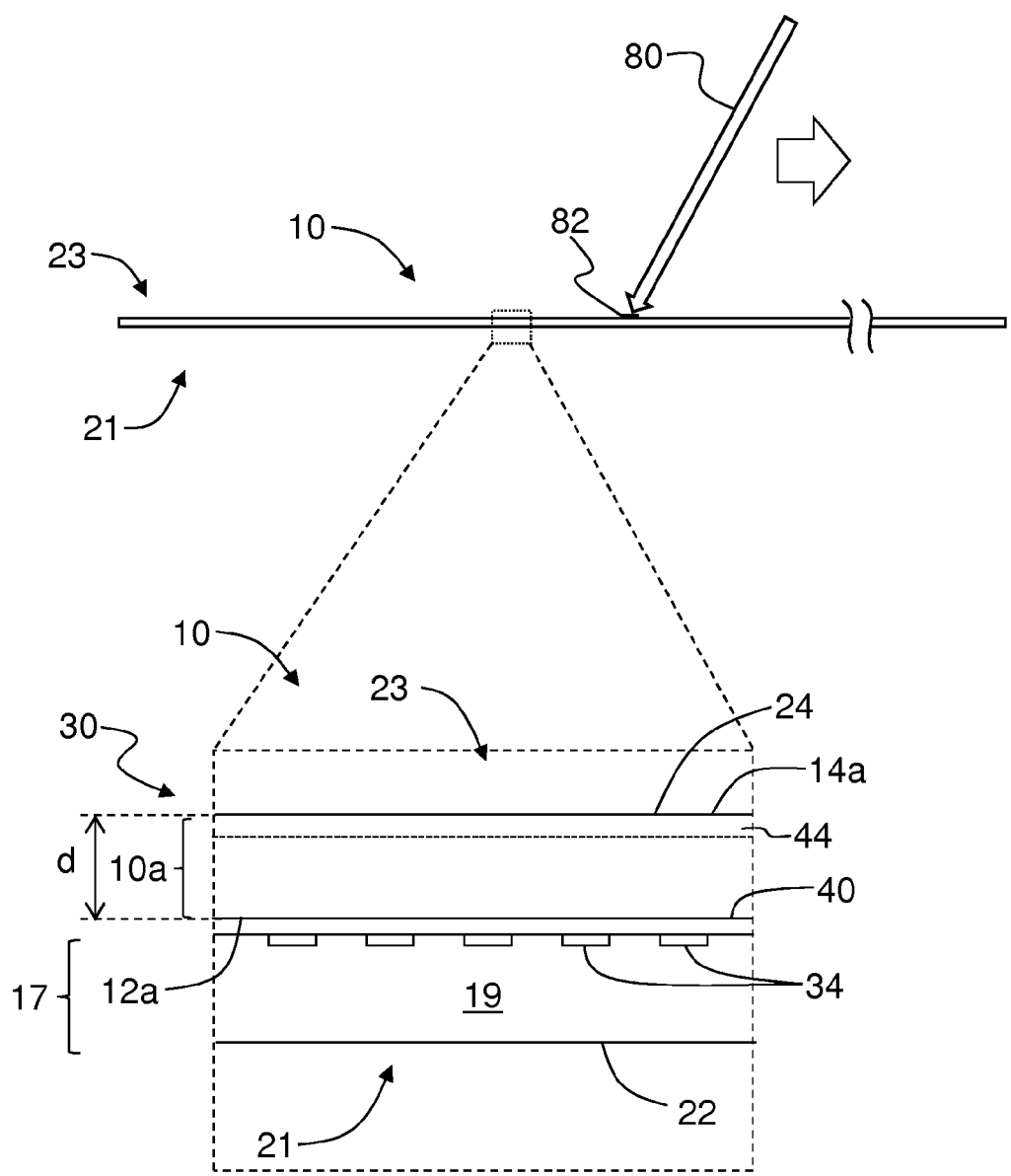
Figure 2D:
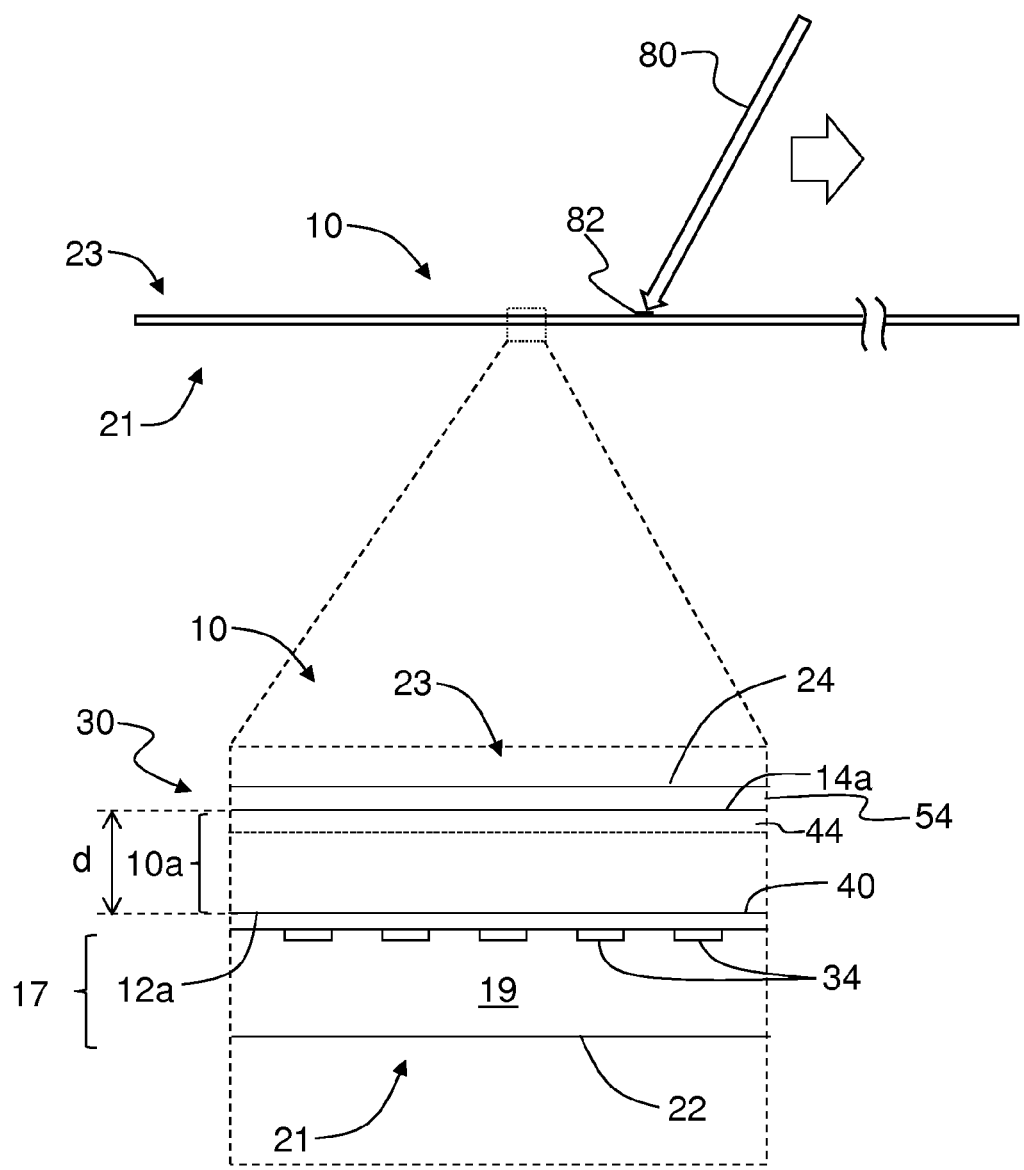

FIG. 2C is similar to FIG. 2A, except that product wafer 10 is not formed by interfacing device wafer 10a with carrier wafer 10b. Rather, the device wafer 10a is provided with a protective layer 19 that covers electronic device structures 34 adjacent the front side 12a of the device wafer 10a to form the top side 21 of product wafer 10. FIG. 2D is the same as FIG. 2C, except that it includes the contact layer 54 similar to that shown in FIG. 2B. The protective layer 19 is used, for example, to avoid damaging the electronic device features 34 when supporting the product wafer 10 using a chuck 110 (see FIG. 3). Examples of the protective layers 19 include silicon dioxide and nitride. Thus, in an example, a protective structure 17 consists of the protective layer 19.

In the example CMOS device structure 30, electronic device features 34 of device wafer 10a reside from about 5 μm to about 150 μm away from device wafer back side 14a, which is usually not patterned. Thus, in an example, back side 14a of device wafer 10a defines a flat and unpatterned wafer back surface 24 that makes for a good annealing surface.

FIGS. 2A through 2D each show an annealing laser beam 80 being scanned over the wafer back side 23 in carrying out the non-melt laser thermal annealing according to the disclosure. The wafer back side 23 includes an annealing region, such as ion-implant layer 44 or contact layer 54, while heat-sensitive electronic device features 34 reside a distance d away from the wafer back side. The annealing region needs be annealed in a manner that does not damage heat-sensitive features 34 that reside a distance d away, wherein, in an example, d is between 5 μm and 150 μm.

Figure 3:
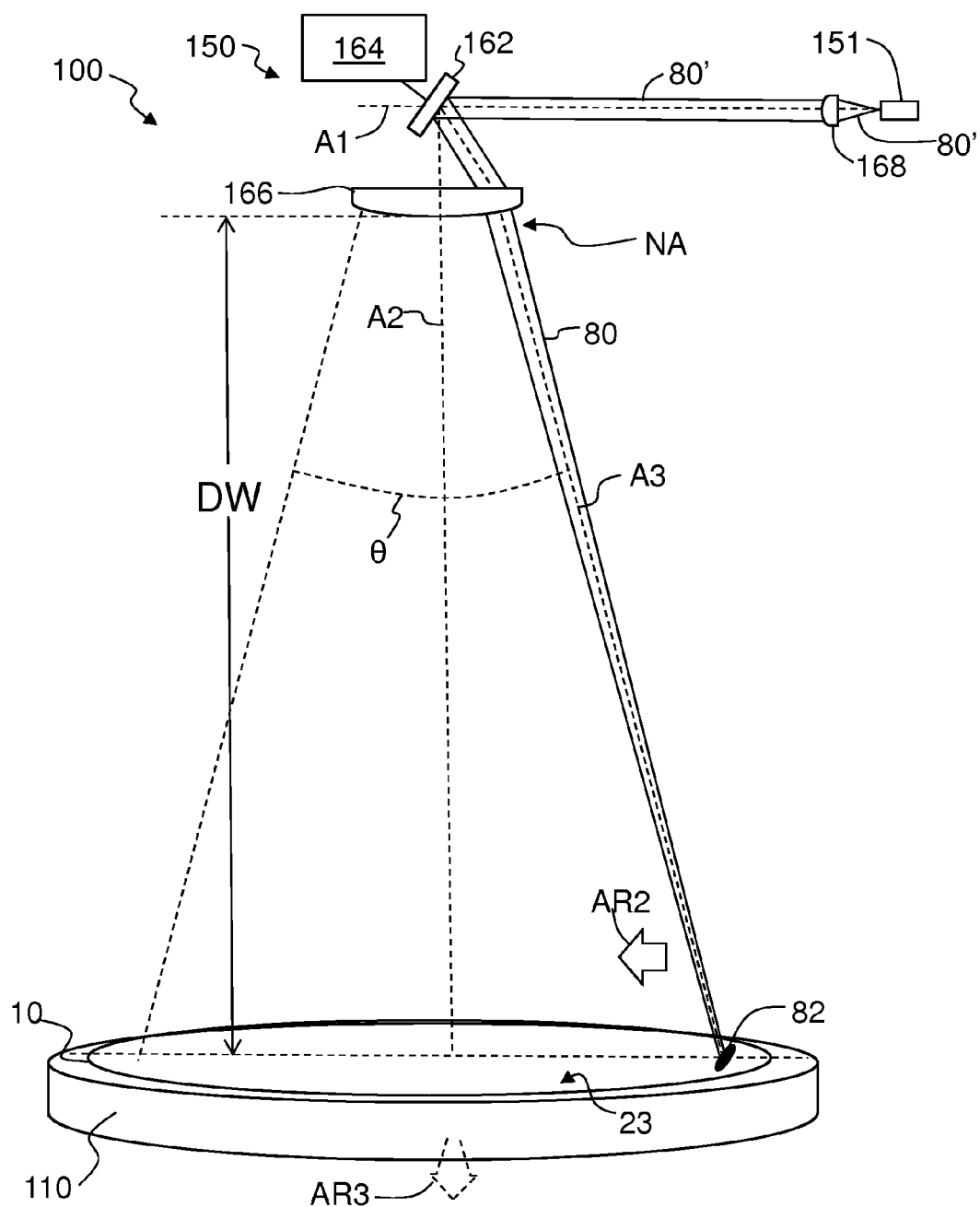
FIG. 3 is a schematic diagram of an example laser annealing apparatus suitable for carrying out the annealing methods disclosed herein.

FIG. 3 illustrates an example laser annealing system 100 that can be used to perform the non-melt laser annealing methods disclosed herein. Example laser annealing systems that can be used to carry out the non-melt laser thermal annealing methods disclosed herein are disclosed in U.S.

Provisional Patent Application Ser. No. 61/658,086, entitled "Laser annealing systems and methods with ultra-short dwell times." With reference to FIG. 3, annealing system 100 includes a scanning laser system 150 and a chuck 110 that supports product wafer 10. In an example, chuck 110 is cooled. Also in an example, chuck 110 is movable.

The scanning laser system 150 includes a laser 151 that generates an initial laser beam 80' along a first axis A1 toward a scanning mirror 162 that is operably connected to a mirror driver 164. The scanning laser system 150 includes a focusing lens 166 oriented along a second axis A2 that is generally at a right angle to first axis A1. The second axis A2 intersects first axis A1 at scanning mirror 162 and also intersects product wafer back side 23 at substantially a right angle. The focusing lens 166 has a numerical aperture NA. In an example, laser 151 generates infrared light so that annealing laser beam 80 includes an infrared wavelength.

In another example, laser 151 generates visible light 80' so that annealing laser beam 80 includes a visible wavelength. A visible wavelength for light 80' is preferred for very thin substrates (e.g., d<30 um) because of the shorter optical absorption depth. In general, it is desirable for the optical absorption depth to be smaller than the thin wafer thickness.

A collimating lens 168 is shown adjacent the laser 151 and receives and collimates divergent laser light 80' from the laser 151. The collimated laser light 80' is reflected by the scanning mirror 162 to the focusing lens 166, which focuses the collimated laser beam 80' to form focused annealing laser beam 80. The focused annealing laser beam 80 in turn forms a line image 82 on the back side 23 of the product wafer 10. The movement of scanning mirror 162 causes the annealing laser beam 80 and line image 82 to move rapidly over the back side 23 of product wafer 10, as indicated by arrow AR2. In an example, annealing laser beam 80 includes a visible wavelength.

The distance from wafer back side 23 to focusing lens 166 is DW. An example distance DW is about 1 meter and an example NA is about 0.15. The mirror driver 164 serves to drive scanning mirror 162, e.g., to rapidly rotate the mirror through a select angular range so that annealing laser beam 80 and line image 82 can scan over a corresponding select angular range denoted in FIG. 3 as θ. In an example, angular range θ is selected so that line image 82 can be scanned across the back side of product wafer 23 from one edge of the product wafer to the opposite edge at the widest part of the wafer.

In an example, annealing laser beam 80 simply sweeps from side to side while between scans product wafer 10 is translated in the cross-scan direction (e.g., by moving chuck 110, as indicated by dashed arrow AR3) so that line image 82 exposes (irradiates) different portions of wafer back side 23 on each scan or at least covers some new portion of the wafer on adjacent scans (i.e., there can be some overlap of adjacent scans). Generally, chuck 110 is movable in three dimensions and is also rotatable in any direction, as needed. In an example, annealing laser beam 80 scans at least a portion of back side 23 of product wafer 10.

The annealing temperature is controlled by the laser power and the anneal time. The anneal time is defined by the dwell time, which is the ratio of laser beam (or line image) width to scanning speed. A typical laser beam width ranges from several microns to a few hundred micrometers, and a typical scanning speed ranges from 0.1 to 5 m/sec.

The annealing conditions of product wafer 10 are such that the device side 12a of product wafer 10 must remain at relatively low temperatures and in particular below the critical temperate $T_C$, which is associated with electronic device features 34. The critical temperature $T_C$ is that temperature beyond which the electronic device features 34 will be damaged. Thus, the annealing method is carried out such that electronic device features 34 remain below the critical temperature $T_C$ in order to protect the ultimate functionality of the device. The maximum temperature at device side 12a is determined by the particular electronic device features 34. For metals used for metallization features 34 such as interconnects, the critical temperature $T_C$ is about 900° C. for copper and 600° C. for aluminum. For devices containing silicide, the critical temperature $T_C$ may also be limited by the thermal stability of the silicide material.

The constraint that electronic device features 34 formed at device side 12a need to remain below a critical temperature $T_C$ gives rise to the requirement that the laser thermal anneal time be short enough to prevent the device surface from becoming too hot. This implies that the thermal anneal time (dwell time) must be such that the corresponding thermal diffusion length $L_D$ is less than the thickness d of device wafer 10a (i.e., $L_D$<d).

Figure 4:
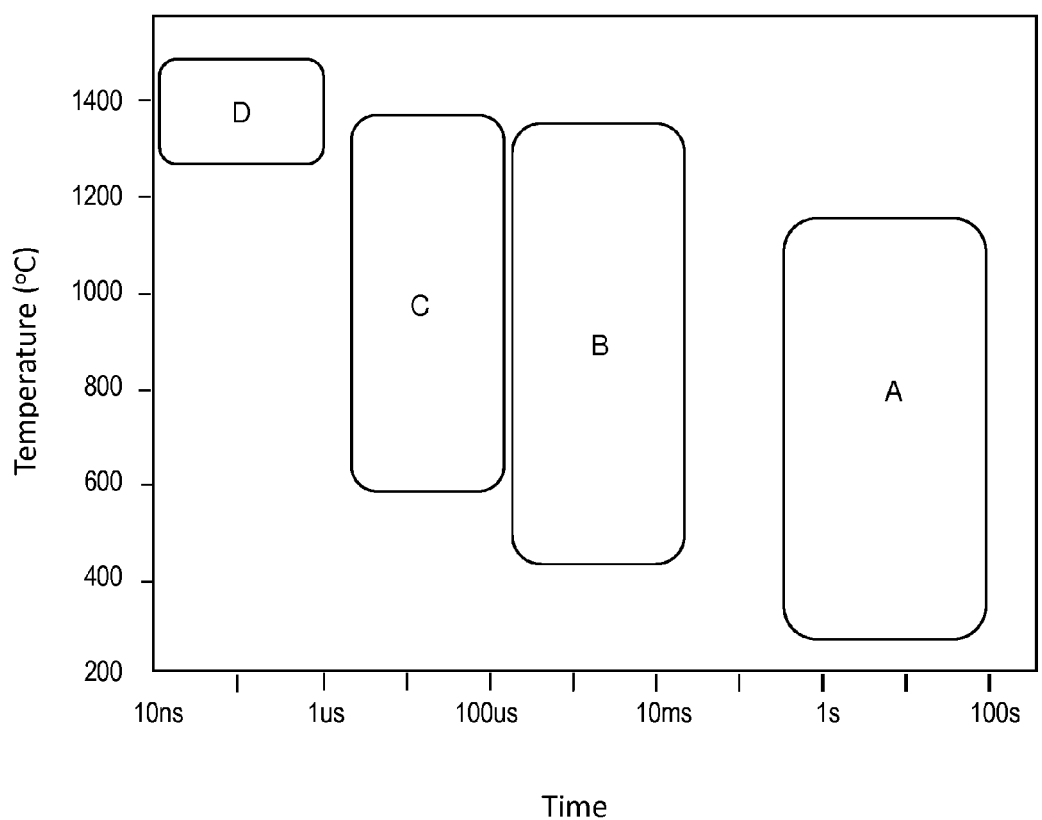
FIG. 4 is a plot of Temperature (° C.) versus Time that shows the process windows for four different annealing methods, including the annealing methods disclosed herein.

FIG. 4 is a plot of Temperature (° C.) versus Time and illustrates the temperature-time process windows for different annealing techniques. FIG. 4 includes four different windows denoted A through D. Conventional rapid thermal processing (RTP) is represented by window A and operates at time scales ranging from seconds to minutes at temperatures of up to 1,200° C. The millisecond-laser and flash-lamp annealing methods are represented by window B and have annealing times ranging from hundreds of microseconds to tens of milliseconds and temperatures just short of the silicon melt point of $T_M$=1,412° C. The pulsed laser melt process is represented by window D and operates at time scales of 10 ns to 1 μs, with a peak temperature above the silicon melt temperature $T_M$.

In FIG. 4, window C is associated with the short-dwell-time, sub-melt laser thermal annealing methods disclosed herein, which operate at annealing times that range from several to a few hundreds of microseconds, and by definition operates at temperatures below the silicon melting temperature $T_M$. Thus, FIG. 4 illustrates how the short-dwell-time, sub-melt laser thermal annealing window C of the thermal annealing temperature-time process space is distinct from the process windows of the other types of conventional annealing. An example range of annealing times for window C is 3 microseconds to 200 microseconds.

Figure 5:
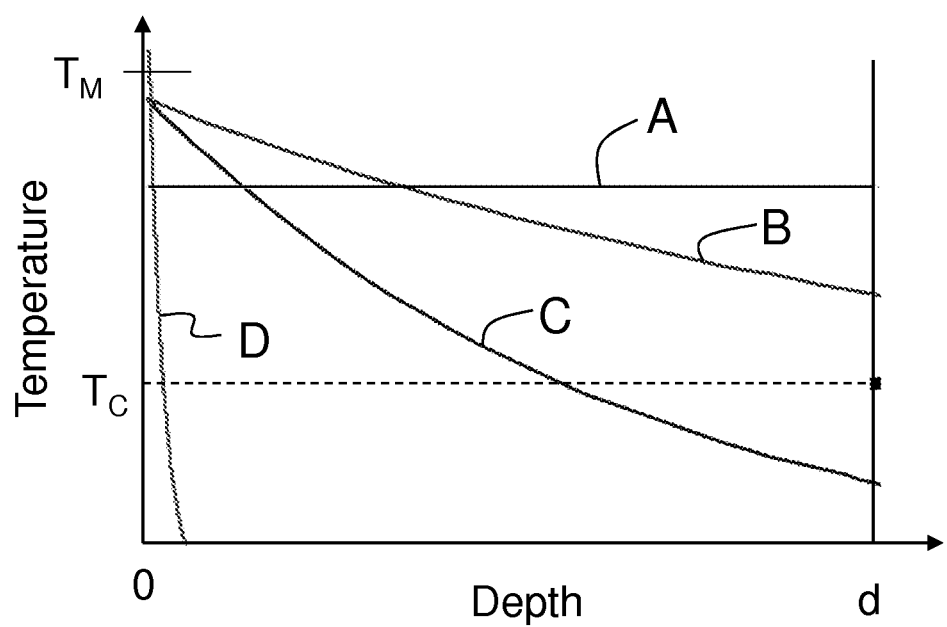
FIG. 5 is a plot of Temperature vs. Depth into a thin silicon wafer and compares the depth temperature profiles across the wafer for four different annealing techniques.

FIG. 5 is a plot of Temperature versus Depth into a thin silicon wafer and compares the depth temperature profiles across a thin silicon wafer for the above four different annealing techniques. The wafer thickness d is in the range of 5 μm to 200 μm. For RTA (curve A), the temperature stays flat through the entire substrate due to the large thermal diffusion length $L_D$ associated with the long anneal times (i.e., $L_D$>>d).

For millisecond-laser or flash-lamp annealing methods (curve B), the temperature decays with the depth d into the wafer. But the rate of decrease is too slow, and, as a result, the temperature at the other side of the wafer can still exceed the damage threshold temperature $T_C$ (i.e., $L_D$>d).

For nanosecond pulsed melt laser annealing (curve D), the temperature drops quickly near the exposed surface, and there is no heat penetration to the other side of the wafer. However, the heat penetration is too shallow to anneal junctions deeper than half a micrometer (i.e., $L_D$<<d).

For short-dwell-time sub-melt laser annealing as disclosed herein (curve C), the temperature drop is fast enough to keep the unexposed side of the wafer cool while the heat penetration is still large enough to anneal deep junctions (i.e., $L_D<d$).

Figure 6A:
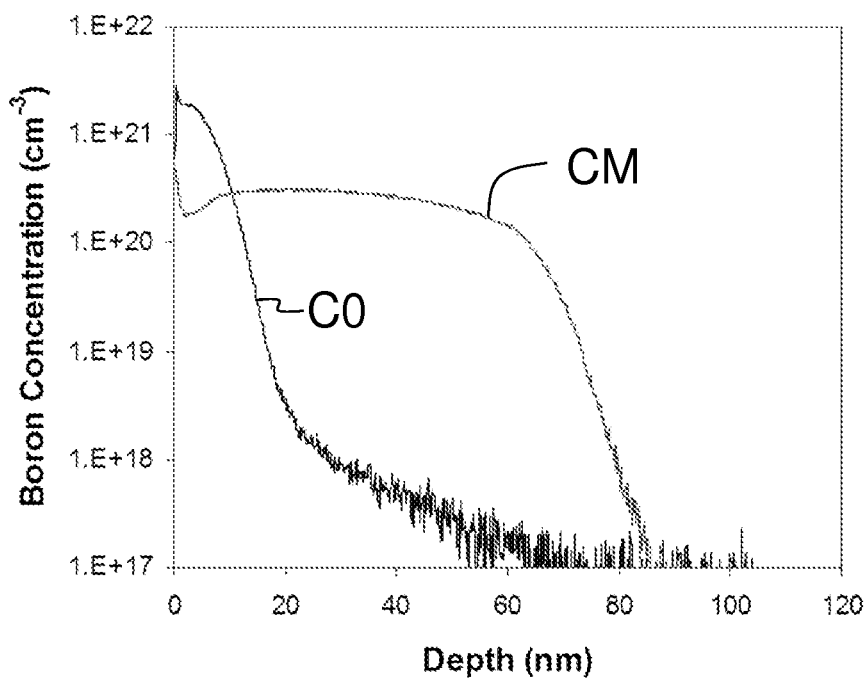
FIGS. 6A and 6B are plots of Boron Concentration ($cm^{-3}$) versus Depth (nm) illustrating how a melt annealing process causes substantial dopant diffusion and a substantial change in the dopant profile (FIG. 6A) as compared to the non-melt annealing methods disclosure herein (FIG. 6B)
Figure 6B:
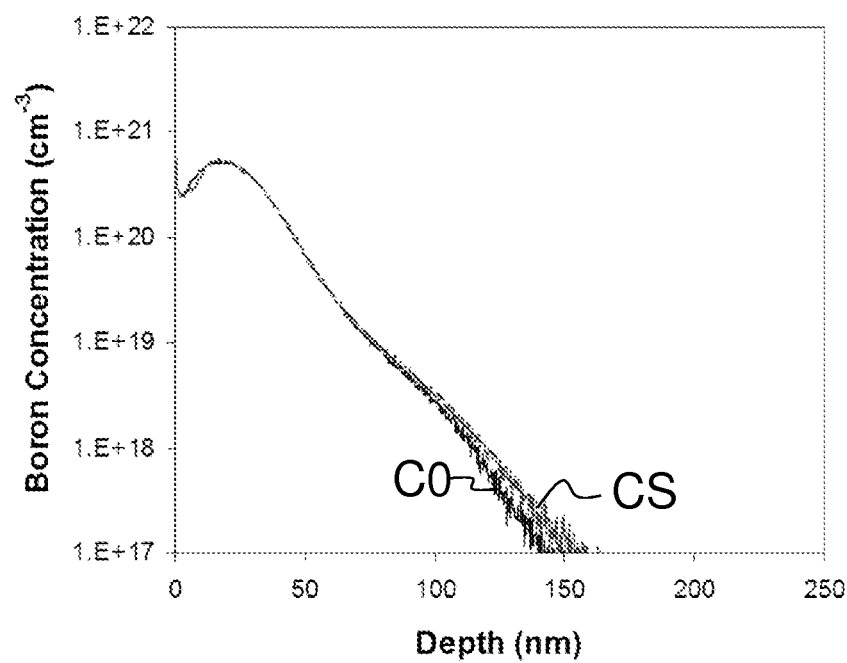

FIGS. 6A and 6B are plots of boron concentration (cm$^{-3}$) versus Depth (nm) into a silicon wafer doped with boron. FIG. 6A includes two curves: curve C0 shows the dopant redistribution with no anneal (i.e., pre-anneal) and curve CM shows the dopant distribution after a laser melt anneal. The junction profile is determined by the melt depth. The melt anneal curve CM shows a box-like dopant redistribution profile due to the fast dopant diffusion that occurs when the silicon is in the liquid state. The diffusion stops at the liquid-solid boundary, giving rise to the abrupt box-like profile. An advantage of this approach is that provides a greater amount of dopant activation and lower electrical resistance. However, the disadvantage is that it causes dopants to redistribute within the melt zone and therefore cannot be applied to cases where precise dopant profiles need to be maintained or to multiple junctions where intermixing of different dopants is undesirable. Further, the activation of dopants is limited to the melt region, and therefore dopants outside the melt region are not effectively activated.

FIG. 6B includes curve C0 as well as a curve CS associated with the short-dwell-time non-melt laser annealing performed according to the present disclosure. It is observed from FIG. 6B that there is no substantial dopant redistribution due to the short dwell-time non-melt laser annealing. This is because the dopants diffuse at a much slower rate when the silicon wafer remains in the solid state. In addition, deep junctions can also be activated because of the increased thermal diffusion length.

Figure 7:
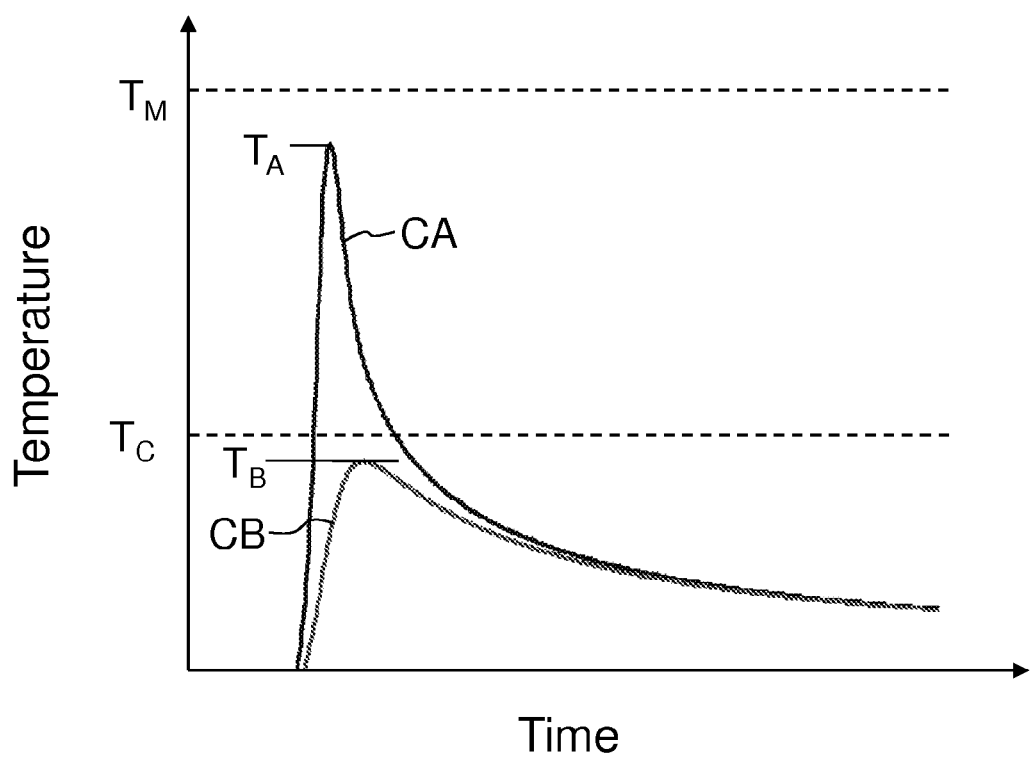
FIG. 7 is a plot of Temperature versus Time and shows example temperate profiles for a point on the product wafer back side and at the location of the electronic device features.

FIG. 7 is a plot of Temperature versus Time and shows a typical temporal temperature profile associated with short-dwell-time non-melt laser annealing. For dopant activation in silicon, the typical peak annealing temperature $T_A$ at the top surface of the wafer ranges from 950° C. to 1,350° C., as shown in a curve CA. The dwell time is selected to ensure that the maximum bottom temperature $T_B$ at the location of (buried) electronic device features 34 is kept below the damage threshold (i.e., critical) temperature $T_C$, as shown in a curve CB. For metal silicide contact applications, a lower annealing temperature $T_A$ may be used, e.g., 600° C. to 1,000° C.

Figure 8:
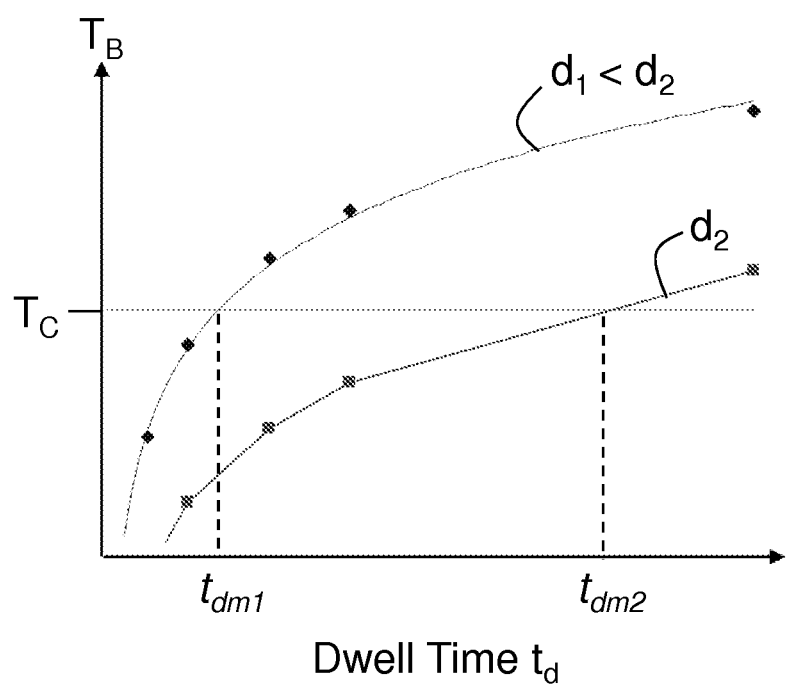
FIG. 8 plots temperature $T_B$ versus dwell time $t_d$ for two product wafers of thickness d1 and d2, where d1<d2 and shows how for a given wafer thickness, the dwell time $t_d$ needs to be below a maximum dwell time $t_{dm}$ to ensure that $T_B$<$T_C$.

FIG. 8 plots the bottom temperature $T_B$ versus dwell time $t_d$ for two wafers of thicknesses d1 and d2, where d1<d2. For a given wafer thickness, the dwell time $t_d$ needs to be below a critical or maximum dwell time $t_{dm}$ to ensure that $T_B<T_C$. The maximum dwell time $t_{dm}$ will depend on the wafer thickness. The thinner the wafer, the smaller the necessary dwell time. For the curve associated with wafer thickness d1, a maximum dwell time $t_{dm1}$ is shown, and for the curve associated with wafer thickness d2, a maximum dwell time $t_{dm2}$ is shown.

Figure 9:
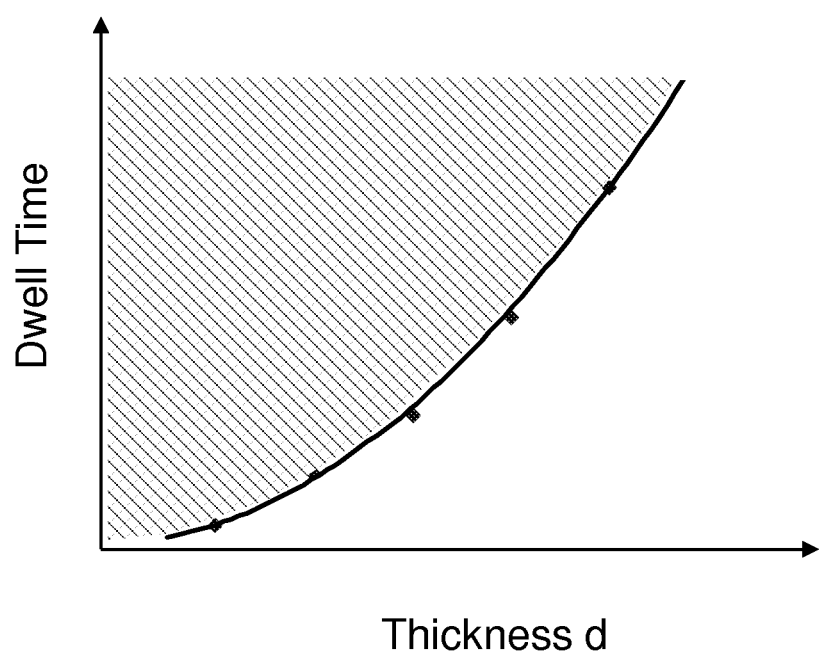
FIG. 9 is a plot of dwell time $t_d$ versus wafer thickness d and shows the limits on the dwell time for a given substrate thickness, as indicated by the shaded area in the plot.

FIG. 9 plots the dwell time vs. wafer thickness d based on simulations. The relationship roughly follows a square law, which is consistent with the fact that thermal diffusion length scales as the square root of time. The shaded area of the plot corresponds to the region of the $t_d$-d process window where device damage would occur. Simulations show that for a wafer thickness of d=40 μm, a dwell time $t_d$ of less than about 70 μs is needed, assuming the critical temperature $T_C$ is limited by damage to the aluminum metallization. Likewise, for a wafer thickness of d=20 μm, the dwell time $t_d$ needs to be less than about 20 μs.

In an example where d ranges from 10 μm to 20 μm, an example dwell time for aluminum electronic device features 34 is in the range from about 3 microseconds to about 20 microseconds, and for copper electronic device features 34 from about 15 microseconds to about 100 microseconds.

To the lowest order of approximation, the maximum dwell time $t_{dm}$ can be estimated by $$t_{dm} \approx \eta \cdot d^2 / D_{eff}$$

where d is the wafer thickness, $D_{eff}$ is the effective thermal diffusivity of the substrate film stack, and n is a function of damage temperature and is usually on the order of 1. In an example embodiment where damage to aluminum metallization is the limiting factor, the maximum dwell time is approximated by $t_{dm}=d^2/D_{eff}$ and the dwell time $t_d$ is selected to be less than this approximate dwell time. In cases where damage to copper metallization is the limiting factor, $t_{dm}$ can be much relaxed, typically by a factor of 5.

One of the key requirements for junction annealing is damage removal capability, which is related to the total thermal budget of the annealing process. In general, the larger the thermal budget, the better the damage removal capability. However, while the short-dwell-time sub-melt laser annealing disclosed herein can avoid overheating electronic device features 34, the reduced dwell time also leads to a smaller thermal budget, which can compromise defect annealing.

Thus, an example annealing method includes either scanning the same area of back side 23 of product wafer 10 multiple times or increasing the overlap of line image 82 between adjacent scans so that each point on the wafer back side is scanned multiple times.

Figure 10:
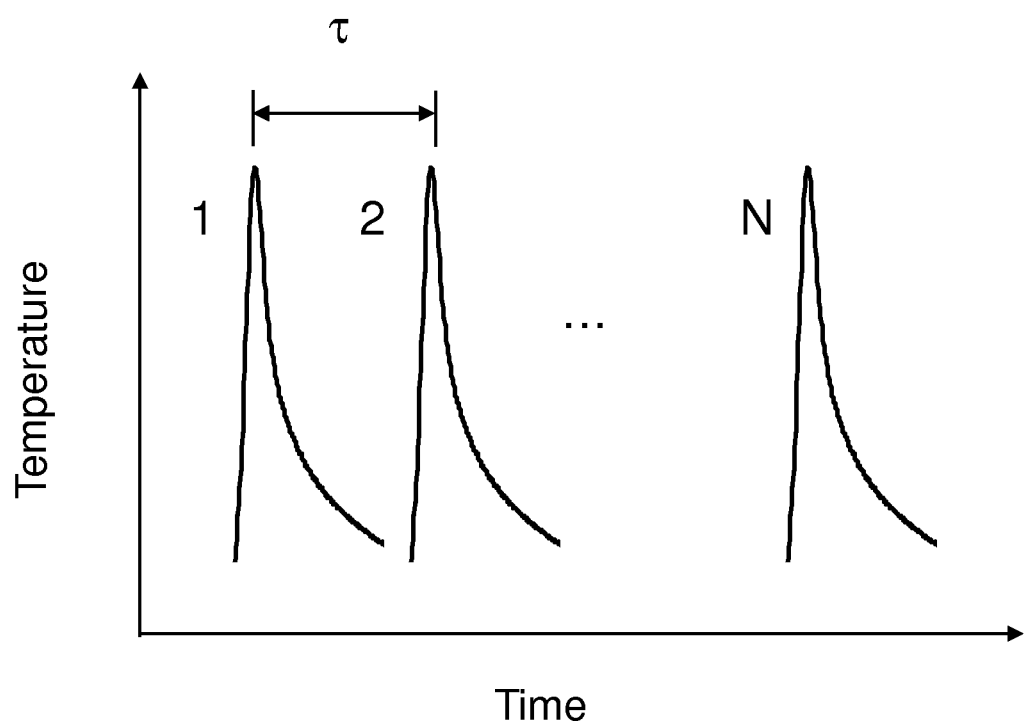
FIG. 10 is a plot of Temperature versus Time and illustrates a series of N typical temperature profiles for a given point on the wafer associated with performing multiple (N) scans of the annealing laser beam.

FIG. 10 is a plot of Temperature vs. Time and shows the typical temperature profile that a given point on wafer back side 23 will experience during multiple (N) scans of annealing laser beam 80. The time interval τ between two successive scans should be long enough for the residual heat from the first scan to fully dissipate before the second scan starts. An example range for heat dissipation time τ is 1 millisecond≤τ≤10 seconds, while in a more limited example τ ranges from several milliseconds to a few hundreds of milliseconds.

Figure 11A:
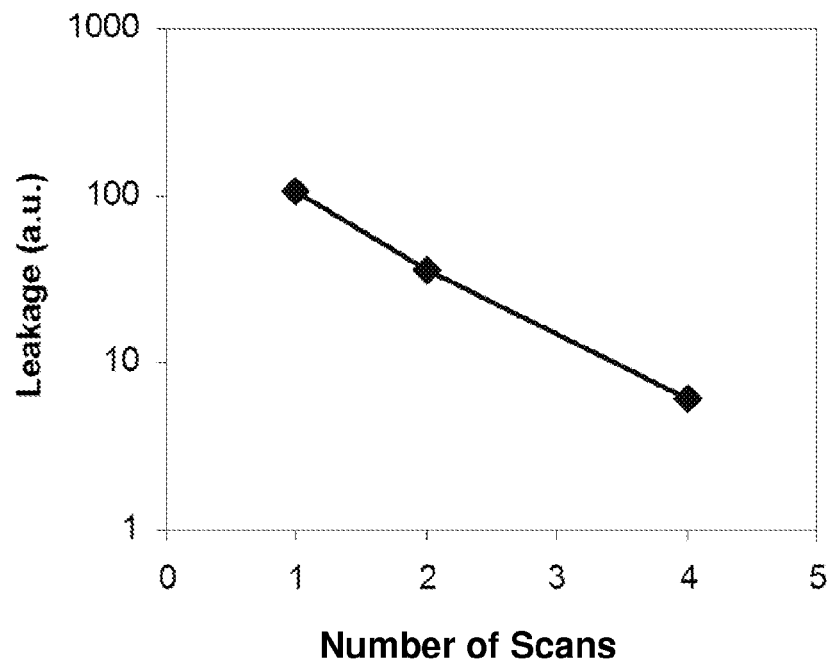
FIG. 11A is a plot of leakage current (arbitrary units, a.u.) versus the number of annealing scans and illustrates a reduction in leakage current with the number of scans, which indicates increasing defect annealing with multiple/successive annealing scans.

FIG. 11A plots the measured junction leakage current (arbitrary units, a.u.) versus the number of scans of annealing laser beam 80. The leakage is a measure of the defect level in the junction depletion region. As the scan number increases, the junction leakage decreases, indicating an improvement in defect annealing.

Figure 11B:
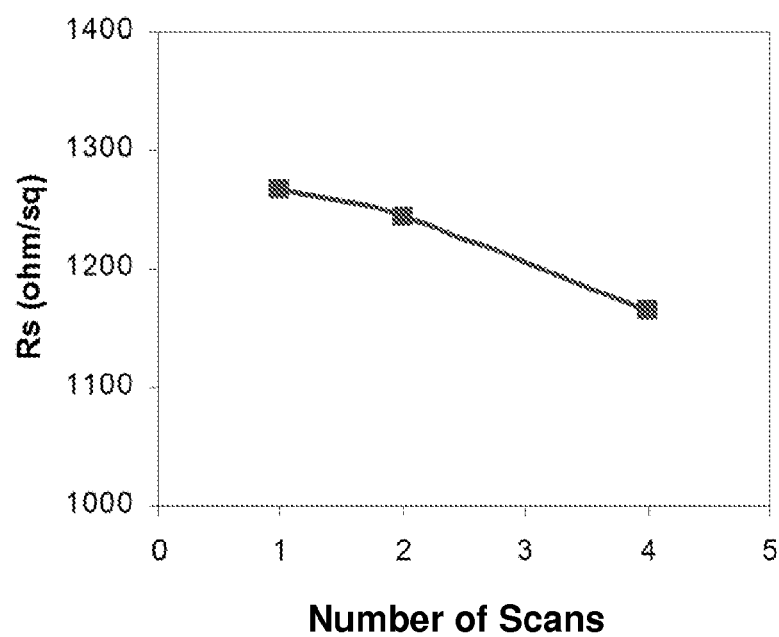
FIG. 11B is a plot of sheet resistance $R_S$ (ohm/sq.) versus number of annealing scans and illustrates how the sheet resistance decreases with an increasing number of scans, which is indicative of enhanced dopant activation.

An added benefit of using multiple sub-melt laser scans is enhanced dopant activation level. This can be seen from FIG. 11B, which plots the measured sheet resistance $R_S$ (ohm/sq.) versus the number of scans of annealing laser beam 80. A reduction in electrical sheet resistance is observed when the scan number increases, indicating enhanced dopant activation.

It is noted that a single, long-dwell-time, sub-melt anneal can also provide good activation and has improved defect removing capability. However, the long thermal diffusion length $L_D$ can lead to damage of electronic device features 34. Using multiple short-dwell-time scans offers an increased thermal budget as compared to a single can approach, while maintaining a thermal diffusion length $L_D$ that is smaller than the wafer thickness d. In an example of the multiple short-dwell-time scan approach, the number of scans is 10 or fewer.

In principle, one can also employ nanosecond pulsed laser annealing in a sub-melt regime and use multiple pulses to improve the dopant activation. However, because of the extremely short anneal duration associated with each laser pulse, a large number of pulses would be needed, i.e., between about 100 and 1,000 pulses. This approach is relatively slow, which makes it problematic to implement in a mass-production environment. In addition, the heat penetration depth of the nanosecond pulsed laser annealing is still limited to about 1 μm (as determined by the individual pulse duration) regardless of the number of pulses used, so that the approach is ineffective in activating deep junctions.

Other factors that could impact the temperature of electronic device features 34 include the temperature of chuck 110 and wafer-to-chuck thermal contact resistance. In general, the lower the chuck temperature or thermal contact resistance, the lower the temperature of electronic device features 34, and hence the longer the dwell time or the higher the top-side annealing temperature can be.

That said, if the chuck temperature is too low, high thermal stress may result due to the large temperature difference between the top and back sides 21 and 23 of product wafer 10. This situation is undesirable because it can cause slip generation and wafer warpage or even wafer breakage. An example chuck 110 is configured with both heating and cooling functionality so that the chuck temperature can be optimized to balance the need of electronic device features 34 for low stress with the features' need for low temperature. To more effectively clamp the wafer frontside temperature, good thermal contact between product wafer 10 and chuck 110 is desirable. This can be achieved by using a vacuum or electrostatic means. To improve the heat-sink capability, materials with high thermal conductivity can be used for chuck 110. Example materials for chuck 110 are aluminum and SiC.

Although the short-dwell-time, non-melt annealing methods disclosed herein are eminently suited for annealing thin wafers, the methods can be used with structures where surface annealing is needed and where heat-sensitive electronic device features 34 are embedded (buried) a distance d from back side 23, i.e., the side of product wafer 10 on which the annealing laser beam is incident. In examples of the annealing method, multiple sub-melt laser scans can be used to enhance dopant activation or improve defect annealing without damaging heat-sensitive electronic device features 34.

It will be apparent to those skilled in the art that various modifications and variations can be made to the present disclosure without departing from the spirit and scope of the disclosure. Thus it is intended that the present disclosure cover the modifications and variations of this disclosure, provided they come within the scope of the appended claims and their equivalents.

What is claimed is:

1. A method of annealing a semiconductor product wafer formed by interfacing a device wafer and a carrier wafer, wherein the device wafer has a thickness d between a front side having electronic device features and a back side having an annealing region, wherein the electronic device features are subject to being damaged beyond a critical temperature $T_C$, the method comprising:
    scanning a single continuous-wave (CW) annealing laser beam over the back side of the device wafer to anneal the annealing region by bringing the annealing region up to an anneal temperature $T_A$ that is less than a melt temperature $T_M$ of the semiconductor product wafer; and
    wherein the scanning of the single CW annealing laser beam has a thermal diffusion length $L_D$ attendant therewith, and further including performing said scanning by selecting a dwell time $t_d$ that is less than a maximum dwell time $t_{dm}$ defined by $t_{dm} = d^2/D_{eff}$, where $D_{eff}$ is an effective thermal diffusivity of the device wafer at the anneal temperature $T_A$ so that the thermal diffusion length $L_D$ satisfies $L_D < d$ and the electronic device features are maintained below the critical temperature $T_C$, wherein 600° C. $T_C \leq$ 900° C.

2. The method according to claim 1, wherein the annealing region includes either an ion-implant layer or a contact layer.

3. The method according to claim 1, wherein the single annealing laser beam has a visible wavelength or an infrared wavelength with an optical absorption length less than the thickness of the device wafer.

4. The method according to claim 1, wherein the electronic device features include a CMOS device layer.

5. The method according to claim 1, wherein the electronic device features include a semiconductor power-device layer.

6. The method according to claim 1, wherein said scanning includes performing multiple scans of the single annealing laser beam over a same portion of the back side, wherein temporally adjacent scans are separated in time by a time interval τ, and wherein 1 millisecond≤τ≤10 seconds.

7. The method according to claim 6, wherein the number of multiple scans is 10 or fewer.

8. The method according to claim 1, wherein 10 μm≤d≤20 μm, and the electrical device features are made of aluminum.

9. The method according to claim 1, wherein 10 μm≤d≤20 μm, the electrical device features are made of copper, and wherein the dwell time $t_d$ is between 15 microseconds to 100 microseconds.

10. The method according to claim 1, wherein the electronic device features include a silicide.

11. The method according to claim 1, wherein the annealing laser beam forms a line image at the backside of the device wafer.

* * * * *